(12) United States Patent
Holmes et al.

(10) Patent No.: US 12,261,232 B1
(45) Date of Patent: Mar. 25, 2025

(54) ULTRAVIOLET SENSORS AND METHODS USING INTEGRATED SILICON CARBIDE LATERAL JUNCTION FIELD-EFFECT TRANSISTORS

(71) Applicants: James A. Holmes, Fayetteville, AR (US); Anthony M. Francis, Elkins, AR (US); Matthew W. Barlow, Springdale, AR (US); Nicholas J. Chiolino, Springdale, AR (US); Sonia M. Perez, Farmington, AR (US)

(72) Inventors: James A. Holmes, Fayetteville, AR (US); Anthony M. Francis, Elkins, AR (US); Matthew W. Barlow, Springdale, AR (US); Nicholas J. Chiolino, Springdale, AR (US); Sonia M. Perez, Farmington, AR (US)

( * ) Notice: Subject to any disclaimer, the term of this patent is extended or adjusted under 35 U.S.C. 154(b) by 401 days.

(21) Appl. No.: 17/744,994

(22) Filed: May 16, 2022

Related U.S. Application Data

(63) Continuation-in-part of application No. 16/778,645, filed on Jan. 31, 2020, now abandoned.

(60) Provisional application No. 62/799,081, filed on Jan. 31, 2019.

(51) Int. Cl.
*H01L 31/0312* (2006.01)
*G01J 1/42* (2006.01)
*H01L 31/112* (2006.01)

(52) U.S. Cl.
CPC .......... *H01L 31/0312* (2013.01); *G01J 1/429* (2013.01); *H01L 31/112* (2013.01)

(58) Field of Classification Search
CPC .......................... H01L 31/1126; H01L 31/028
See application file for complete search history.

(56) References Cited

U.S. PATENT DOCUMENTS

| | | | |
|---|---|---|---|
| 7,521,737 B2 | 4/2009 | Augusto | 257/233 |
| 7,863,647 B1 | 1/2011 | Veliadis | 257/186 |
| 9,368,537 B1 * | 6/2016 | Holmes | H02S 40/44 |
| 9,798,458 B2 | 10/2017 | Dumont et al. | |
| 9,880,052 B2 | 1/2018 | Dumont et al. | |
| 9,893,227 B2 | 2/2018 | Sampath et al. | |
| 2015/0349186 A1 | 12/2015 | Hsu et al. | |

OTHER PUBLICATIONS

Neudeck et al. ("Yearlong 500 degree C Operational Demonstration of Up-scaled 4H-SiC JFET Integrated Circuits", 2018 IMAPs International Conference on High Temperature Electronics (HITEC 2018) May 9, 2018 Albuquerque, New Mexico USA). (Year: 2018 ).*

* cited by examiner

*Primary Examiner* — David P Porta
*Assistant Examiner* — Meenakshi S Sahu
(74) *Attorney, Agent, or Firm* — Keisling & Pieper PLC; David B. Pieper; Trent C. Keisling

(57) ABSTRACT

An ultraviolet detecting silicon carbide junction field effect transistor with a transistor gate junction positioned proximate to the outer surface to receive ultraviolet: light and flow an ultraviolet light induced photo current when reverse biased.

3 Claims, 4 Drawing Sheets

US 12,261,232 B1

ULTRAVIOLET SENSORS AND METHODS USING INTEGRATED SILICON CARBIDE LATERAL JUNCTION FIELD-EFFECT TRANSISTORS

CROSS-REFERENCE TO RELATED APPLICATIONS

This application claims priority to and is a continuation-in-part of U.S. patent application Ser. No. 16/778,645, filed on Jan. 31, 2020 entitled Ultraviolet Sensors and Methods Using Integrated Silicon Carbide Lateral Junction Field-Effect Transistors which is a continuation-in-part of U.S. Provisional Patent Application Ser. No. 62/799,081, filed on Jan. 31, 2019 entitled Ultraviolet Sensors and Methods Using Integrated Silicon Carbide Lateral Junction Field-Effect Transistors which is hereby incorporated by reference in its entirety.

STATEMENT REGARDING FEDERALLY SPONSORED RESEARCH OR DEVELOPMENT

This invention was made with government support by Small Business Innovation Research (SBIR) and Small Business Technology Transfer (STTR), SBIR/STTR-GTC-0024 with cooperative agreement DE-SC0017731. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in ultraviolet sensors. More particularly, the invention relates to improvements particularly suited for providing a junction gate field-effect transistor operated as an ultraviolet detector.

2. Description of the Known Art

As will be appreciated by those skilled in the art, electronics are known in various forms. Patents disclosing information relevant to the present application includes: U.S. Pat. No. 9,798,458, issued to Dumont, et al. on Oct. 24, 2017 entitled Methods, systems, and apparatuses for accurate measurement and real-time feedback of solar ultraviolet exposure; U.S. Pat. No. 9,893,227, issued to Sampath, et al. on Feb. 13, 2018 entitled Enhanced deep ultraviolet photodetector and method thereof U.S. Pat. No. 9,880,052, issued to Dumont, et al. on Jan. 30, 2018 entitled Methods, systems, and apparatuses for accurate measurement and real-time feedback of solar ultraviolet exposure; U.S. Pat. No. 9,368,537, issued to Holmes, et al. on Jun. 14, 2016, entitled Integrated silicon carbide ultraviolet sensors and methods; U.S. Pat. No. 7,521,737, issued to Augusto on Apr. 21, 2009 entitled Light-sensing device; U.S. Pat. No. 7,863,647, issued to Veliadis on Jan. 4, 2011 entitled SiC avalanche photodiode with improved edge termination; and United States Patent No. application No. 20150349186, filed by HSU; KLAUS Y. J.; et al. on Dec. 3, 2015 entitled PHOTOTRANSISTOR WITH BODY-STRAPPED BASE. Each of these patents is hereby expressly incorporated by reference in their entirety.

Other articles for consideration include P. G. S. Neudeck, "6H-SiC Transistor Integrated Circuits Demonstrating Prolonged Operation at 500 C," presented at the International Conference on High Temperature Electronics, Albuquerque, NM, United States, May 2008. Available: https://ntrs.nasa-.gov/search.jsp?R=20150022226. This reference is also incorporated by reference.

From these prior references it may be seen that these prior art patents are very limited in their teaching and utilization, and an improved ultraviolet sensor is needed to overcome these limitations.

SUMMARY OF THE INVENTION

The present invention is directed to an improved ultraviolet sensor using a silicon carbide junction field effect transistor by applying a reverse bias to induce a photo-current in the junction field effect transistor gate-channel diode to produce a useable junction field effect transistor photo-detector. One embodiment of the present invention includes an ultraviolet detecting silicon carbide junction field effect transistor with a transistor gate junction positioned proximate to the outer surface to receive ultraviolet light and flow an ultraviolet light induced photo current when reverse biased while still providing normal forward biased transistor operation. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As shown in FIGS. 1-4 of the drawings, one exemplary embodiment of the present invention is generally shown as a silicon carbide junction field effect transistor. By reverse biasing and shining ultraviolet light the JFET gate-channel diode junction, the JFET gate-channel junction produces a photo-current that can be transformed and amplified by integrated circuitry. This is proven through the JFET gate-channel diode photo-current measurement using a 280 nm UV-LED source as provided in FIG. 4.

Figure 1:
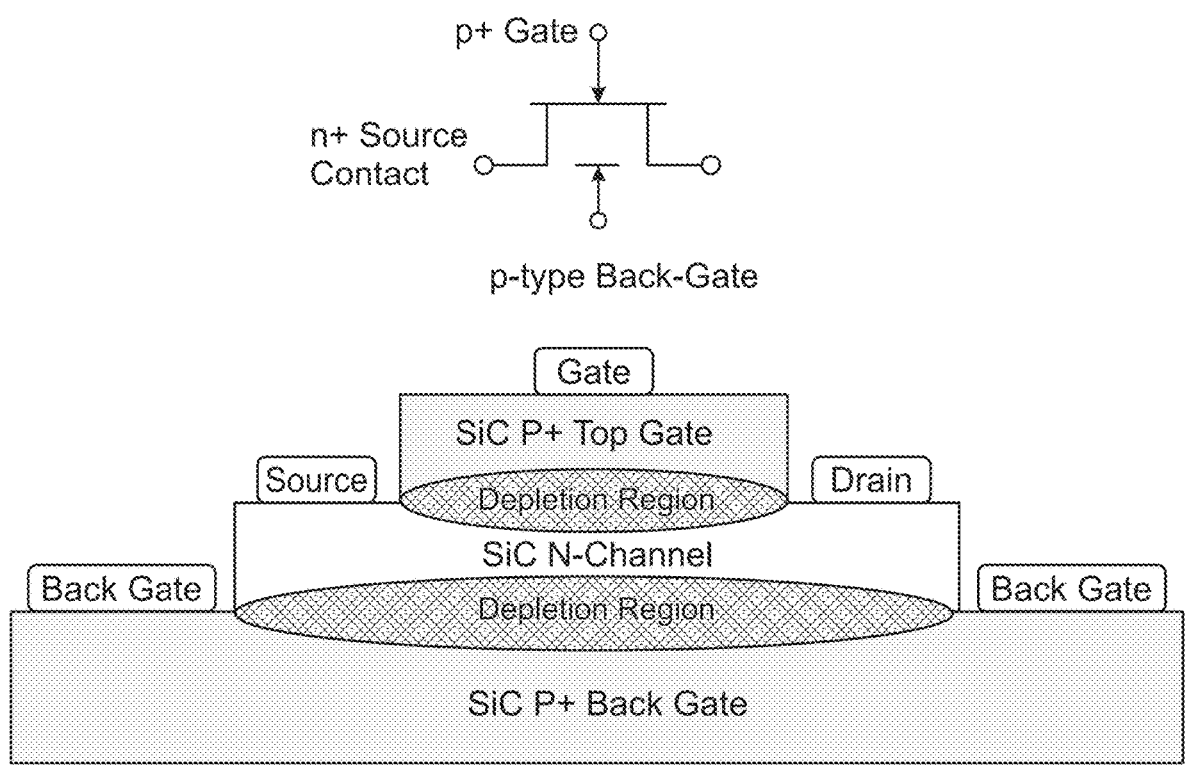
FIG. 1 shows a SIC JFET.

The invention utilizes the NASA GRC SIC JFET-R process which was invented for developing high-temperature electronic solutions using this process (DE-SC00017131) for geothermal and down-hole instruments. On this project (DE-SC0017731) the device was measured under UV illumination and the present invention was made. The JFET process cross-section is shown in FIG. 1. Note that the cross section allows UV light to penetrate to the gate.

Figure 2:
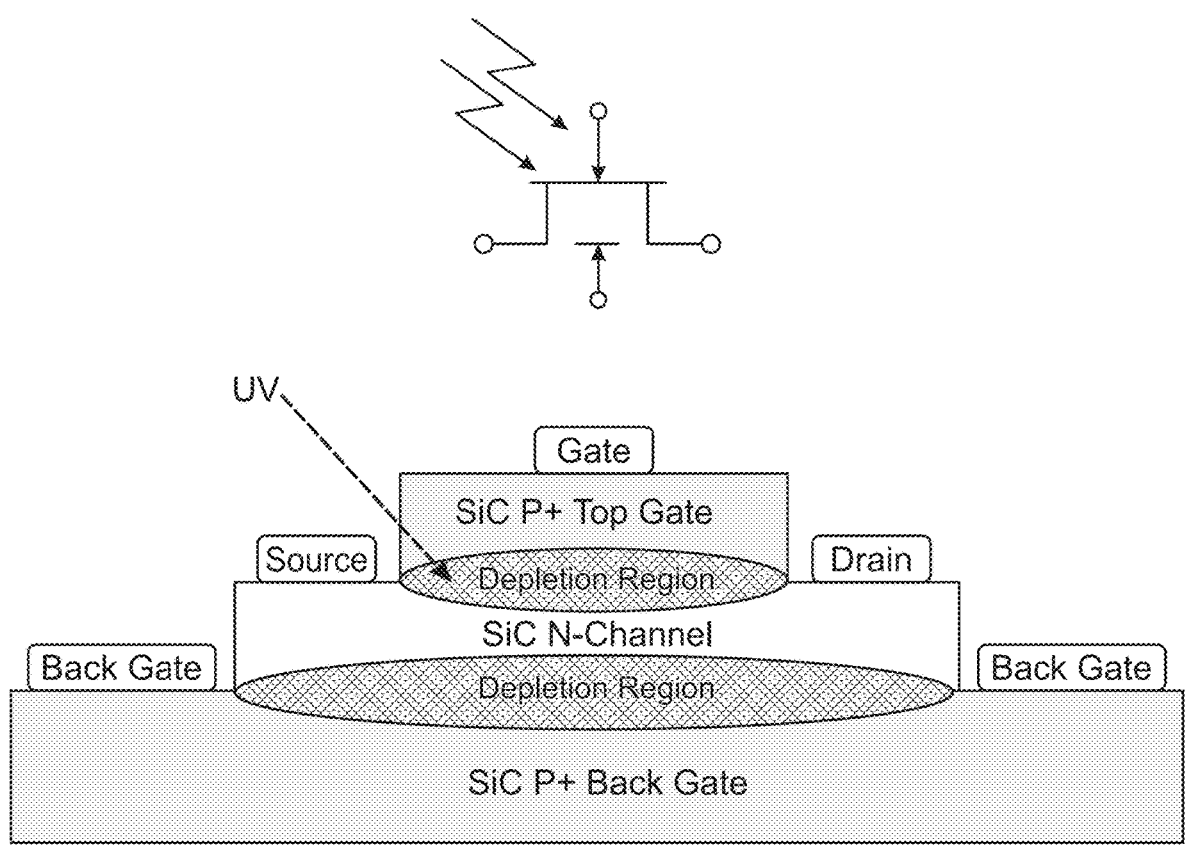
FIG. 2 shows shining UV light on JFET gate-channel diode junction.
Figure 3:
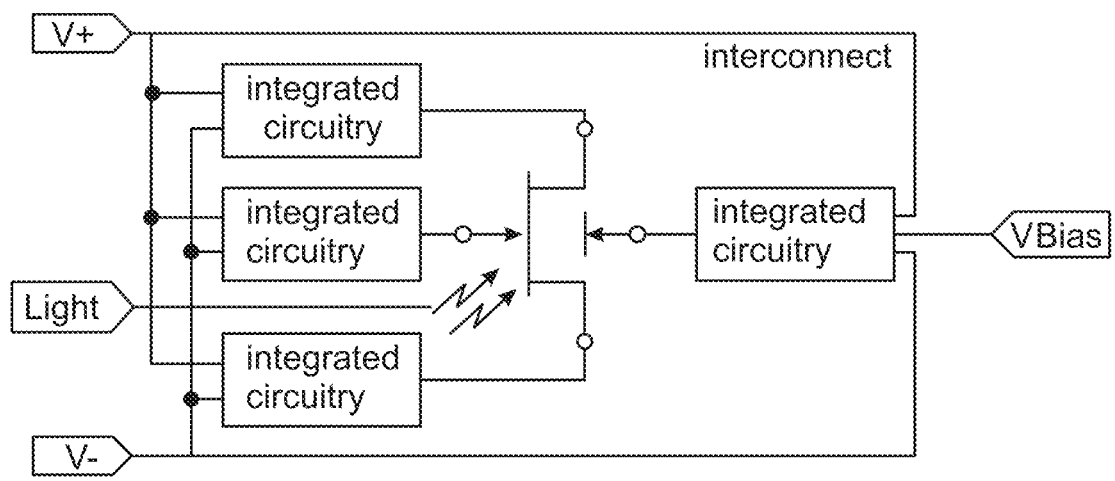
FIG. 3 shows a JFET gate-channel junction producing a photo-current that is transformed and amplified by integrated circuitry.
Figure 4:
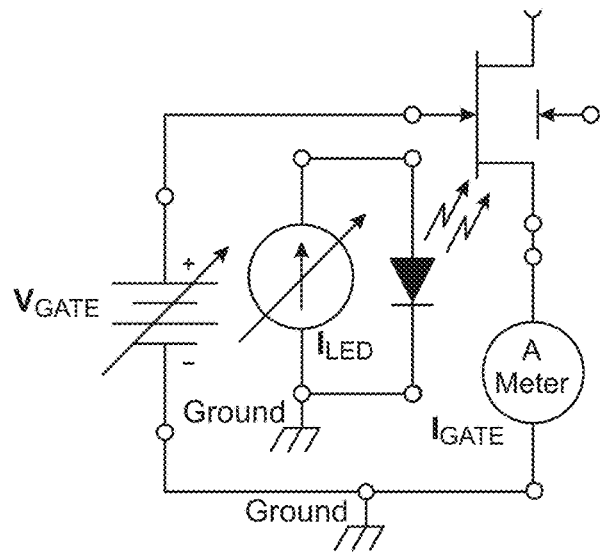
FIG. 4 shows a JFET gate-channel diode photo-current measurement using a 280 nm UV-LED source.
Figure 4:
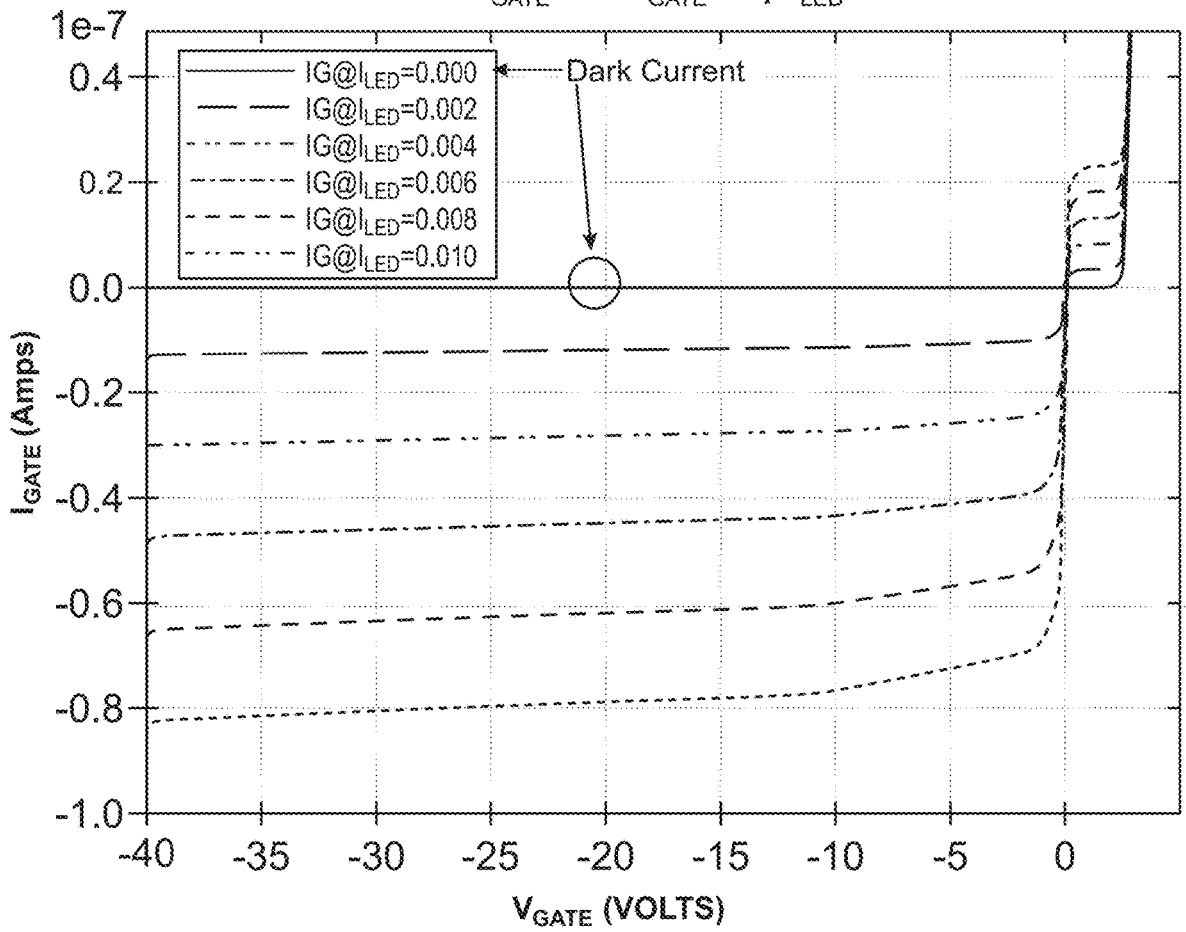

The present invention is the use of this JFET by shining ultraviolet light (100 nm>λ>380 nm) to induce a photo-current in the JFET gate-channel diode to produce a useable photo-detector as shown in FIG. 2. FIG. 2 shows shining UV light on JFET gate-channel diode junction. In this manner, the JFET gate-channel junction is operated as a UV photo-detector. Photo-current from the photo-detectors is transformed and amplified by devices and circuits integrated monolithically with the photo-detector. Thus, the integrated circuitry, bias, condition and amplifying the photo-current is show in FIG. 3. The integrated circuit forms detector with the readout coming from one of the integrated circuits, depending on the application of the integrated circuit. Thus, both a photo detector and a normal JFET circuit can be provided. The JFET acts like a transistor in the circuit when a forward bias is applied, the JFET acts like a photodetector when a reverse bias is applied. FIG. 3 shows the JFET gate-channel junction produces photo-current that is transformed and amplified by integrated circuitry with both the intensity of the ultraviolet light and the bis controlling the output current. The Photo-current of the JFET gate-channel diode junction was measured in the laboratory to confirm the invention works as shown in FIG. 4. Without UV light present the JFET gate-channel diode presents a normal diode I-V characteristic which is referred to as the dark-current I-V characteristics. Under increasing UV illumination, the I-V characteristics diverges from the dark-current characteristic as shown in FIG. 4 thus producing a useful light-to-current transformation. FIG. 4 shows the JFET gate-channel diode photo-current measurement using 280 nm UV-LED source.

EIR: 10046924-18-0008

The DOE "S" Number is T-116074

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A photodetection circuit for ultraviolet light, the circuit comprising:
    a silicon carbide junction field effect transistor with an outer surface, the silicon carbide junction field effect transistor including a transistor gate junction positioned proximate to the outer surface to receive ultraviolet light;
    a reverse bias circuit connected to the transistor gate junction to provide a reverse bias voltage;
    the ultraviolet light and reverse bias voltage inducing a photo current at the transistor gate junction.

2. The circuit of claim 1, further comprising:
    the silicon carbide junction field effect transistor including a drain to source connection;
    a power supply connected across the drain to source connection;
    a positive bias circuit connected to the transistor gate junction to provide a positive bias voltage;
    the positive bias voltage inducing a transistor current at the drain to source connection.

3. A method for utilizing a silicon carbide junction field effect transistor as both a transistor and as a photo detector, the method comprising:
    providing a silicon carbide junction field effect transistor with an outer surface, the silicon carbide junction field effect transistor including a drain to source connection and a transistor gate junction positioned proximate to the outer surface to receive ultraviolet light;
    providing a power supply connected across the drain to source connection to provide a transistor power flow;
    providing a variable biasing circuit at the transistor gate junction for providing a positive bias or alternatively providing a negative bias;
    providing a positive bias to control the transistor power flow; and
    providing a negative bias and receiving ultraviolet light at the transistor gate junction to induce a photo current through the transistor gate junction.

* * * * *